United States Patent
Edwards et al.

(10) Patent No.: US 9,176,159 B2
(45) Date of Patent: Nov. 3, 2015

(54) VARIABLE RELUCTANCE SENSOR INTERFACES WITH SIGNAL PRE-PROCESSING AND METHODS OF THEIR OPERATION

(71) Applicant: Freescale Semiconductor, Inc., Austin, TX (US)

(72) Inventors: William E. Edwards, Ann Arbor, MI (US); Mike R. Garrard, Jaywick (GB)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 285 days.

(21) Appl. No.: 14/045,476

(22) Filed: Oct. 3, 2013

(65) Prior Publication Data

US 2015/0097557 A1    Apr. 9, 2015

(51) Int. Cl.

| | |
|---|---|
| *G01B 7/30* | (2006.01) |
| *G01P 3/488* | (2006.01) |
| *G01D 1/00* | (2006.01) |
| *G01D 5/20* | (2006.01) |
| *B60R 1/00* | (2006.01) |
| *F16H 27/00* | (2006.01) |

(52) U.S. Cl.
CPC ........ *G01P 3/488* (2013.01); *G01D 1/00* (2013.01); *G01D 5/20* (2013.01); *B60R 1/00* (2013.01); *F16H 27/00* (2013.01); *H01L 2221/00* (2013.01)

(58) Field of Classification Search
CPC .............. G01D 1/00; G01L 1/00; G01L 7/00; B60R 1/00; B60R 2225/00; H01L 21/00; H01L 2221/00; F16H 1/00; F16H 7/00; F16H 13/00; F16H 21/00; F16H 27/00; F16H 39/00; F16H 51/00; F16H 59/00; F16H 2200/00; H01F 1/00; G01R 1/00
See application file for complete search history.

(56) References Cited

U.S. PATENT DOCUMENTS

| | | | |
|---|---|---|---|
| 5,977,765 A | 11/1999 | Gibson et al. | |
| 6,424,147 B1* | 7/2002 | Kato | B62D 15/02 324/207.2 |
| 6,674,279 B2 | 1/2004 | Manlove et al. | |
| 2005/0139017 A1* | 6/2005 | Tokumoto | B62D 6/10 73/862.328 |
| 2005/0270019 A1* | 12/2005 | Shinjo | G01D 5/145 324/207.25 |
| 2010/0201356 A1* | 8/2010 | Koller | B29C 45/0013 324/252 |
| 2010/0219822 A1* | 9/2010 | Suzuki | G01D 1/00 324/252 |
| 2010/0308808 A1* | 12/2010 | Yamagata | G01D 1/00 324/207.25 |
| 2013/0328554 A1 | 12/2013 | Pigott et al. | |
| 2014/0035561 A1 | 2/2014 | Pigott et al. | |

* cited by examiner

*Primary Examiner* — Huy Q Phan
*Assistant Examiner* — Temilade Rhodes-Vivour
(74) *Attorney, Agent, or Firm* — Ingrassia Fisher & Lorenz, P.C.

(57) ABSTRACT

The embodiments described herein can provide a variable reluctance sensor (VRS) interface that may reduce the probability of erroneous transitions in a resulting generated detect signal. As such, the VRS interface can improve the accuracy of position and/or motion determinations, and thus can improve the performance of a wide variety of devices that use variable reluctance sensors. To facilitate this, the VRS interface includes a pre-processing circuit configured to modify a VRS signal to prevent the modified VRS signal from dropping below a threshold value and generating erroneous transitions in the detect signal pulse between leading and lagging edges of a tooth. In one embodiment the pre-processing circuit comprises a peak and hold circuit. In another embodiment the pre-processing circuit comprises a resistor-capacitor circuit. In either case the pre-processing circuit can prevent erroneous transitions in the detect signal and thus may improve the performance and accuracy of the system.

20 Claims, 6 Drawing Sheets and in the coil. A VRS interface senses and conditions the electrical signal to derive timing parameters. In this manner, the rotating motion of the crankshaft is converted to an electronic signal which is used to determine the position and speed of the crankshaft.
VARIABLE RELUCTANCE SENSOR INTERFACES WITH SIGNAL PRE-PROCESSING AND METHODS OF THEIR OPERATION

TECHNICAL FIELD

Embodiments of the subject matter described herein relate generally to variable reluctance sensors.

BACKGROUND

Variable reluctance sensors (VRSs) are commonly used to measure the angular position and/or speed of a moving or rotating ferromagnetic object. For example, they can be used to measure the angular position and/or speed of a rotating wheel having one or more teeth. One such application is the crankshaft of an automobile. For example, a toothed ferrous (iron based) wheel is mounted to the crankshaft and the VRS is used to sense each passing tooth during rotation of the crankshaft.

In such an application crankshaft position can be used to set engine timing for engine control including ignition and fuel injection timing and the like. The VRS typically includes a coil and biasing magnet positioned near the toothed wheel, in which each tooth passing by the VRS changes the magnetic flux which is converted to an electrical voltage induced in the coil. A VRS interface senses and conditions the electrical signal to derive timing parameters. In this manner, the rotating motion of the crankshaft is converted to an electronic signal which is used to determine the position and speed of the crankshaft.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
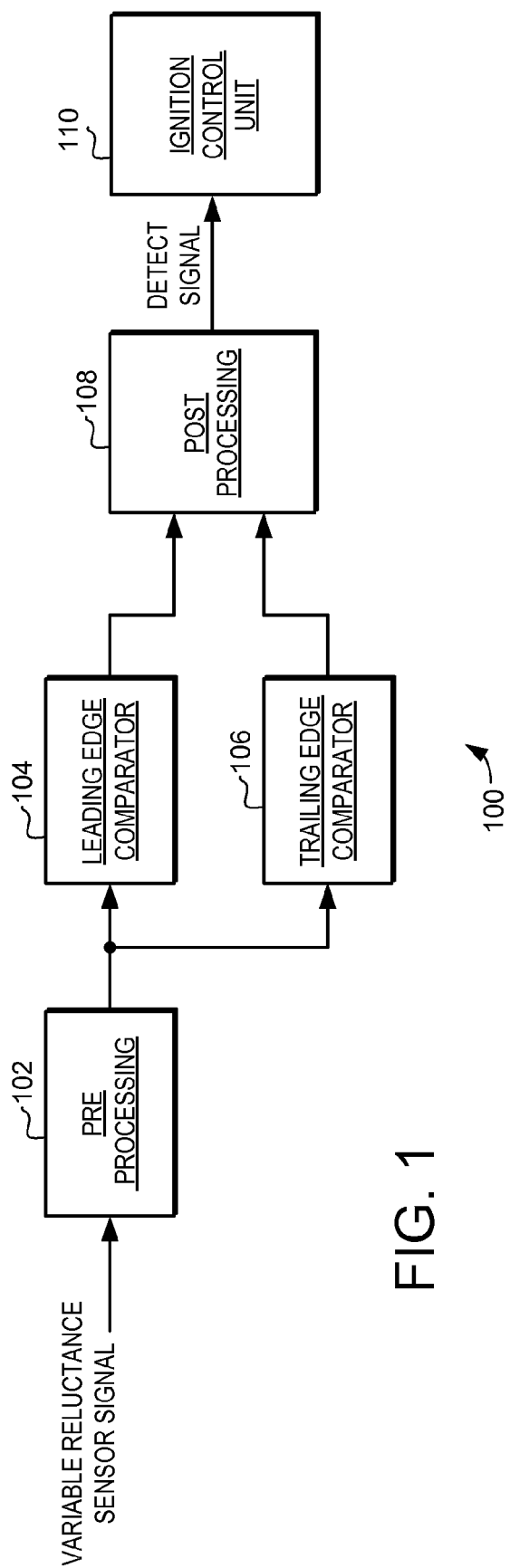
FIG. 1 is a schematic diagram of a variable reluctance sensor interface in accordance with an example embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Variable reluctance sensors (VRSs) are commonly used to measure the angular position and/or speed of rotating objects. For example, they can be used to measure the angular position and/or speed of a rotating shaft such as a crank or cam shaft in an internal combustion engine where a wheel having one or more teeth is mounted on the shaft. Typical VRSs include a coil and biasing magnet positioned near the toothed wheel, and each tooth passing by the VRS causes a change in the magnetic flux which is converted to an electrical voltage induced in the coil. This induced voltage generates a VRS signal. A VRS interface senses and conditions the VRS signal to derive timing parameters of the wheel. In this manner, the rotating motion of the wheel is converted to an electronic signal which is used to determine the position and/or speed of the wheel.

In one example the VRS signal is processed to generate a detect signal pulse corresponding to the tooth width in degrees. Specifically, the increase in VRS signal caused by the leading edge of the tooth passing by the VRS biasing magnet is detected by the VRS and used to generate the leading edge of the detect signal pulse. Likewise, the decrease in VRS signal caused by the trailing edge of the tooth passing by the VRS magnet is detected and used to generate the trailing edge of the detect signal pulse. In a typical implementation the detections of these edges are performed by comparators that receive the VRS signal, with a first comparator used to detect the leading edge of the tooth and a second comparator used to detect the trailing edge of the tooth. The two detections together generate the detect signal pulse with a width that corresponds to the timing difference between the leading and trailing edges of the tooth. Thus generated, the rising & falling edges of the detect signal pulse can be used to determine the angular position(s) and/or speed of the tooth and the wheel.

In many cases the accurate generation of the detect signal pulse can be negatively impacted by the effects of various physical properties of the electro-mechanical system, such as synchronous and asynchronous noise, the dynamic range of the input signal, and signal variations caused by aging and mechanical tolerances, such as tooth variations, relative placement between the sensor and tooth placement, etc. For example, turning to FIG. 6, graphical representations of an exemplary VRS signal 602 and a resulting detect signal 604 generated by a VRS interface are illustrated. In this example the detect signal 604 has erroneous transitions at times T3 and T4 that do not correspond to actual edges of the tooth. Thus, such transitions in detect signal 604 can result in erroneous determinations of position and/or speed of the wheel.

Figure 6:
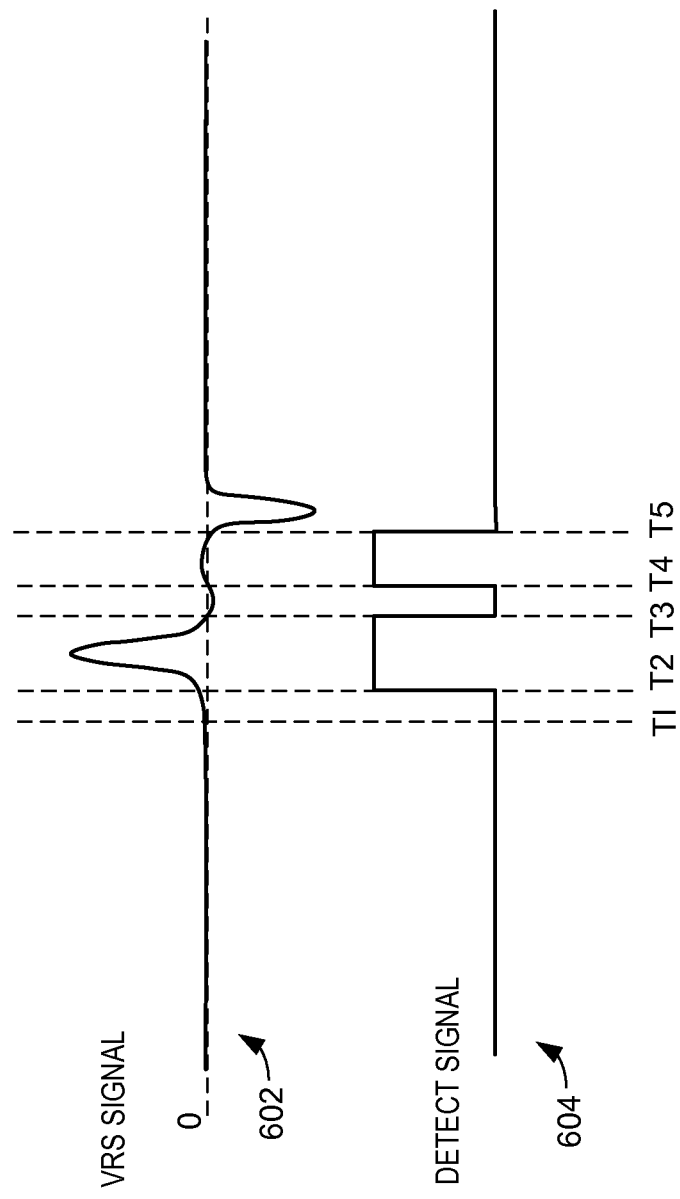
FIG. 6 is a graphical representation of a variable reluctance sensor signal and detect signal pulse.

In the example of FIG. 6 at time T1 the VRS signal 602 begins to increase in response to the leading edge of the tooth rotating toward the sensor and the resulting change in magnetic flux detected by the VRS. At time T2 the VRS interface generates the leading edge of a detect signal 604 pulse in response to the resulting VRS signal 602 rising above a threshold value. The VRS signal 602 peaks, then, as the leading edge of the tooth passes the sensor the VRS signal 602 drops as the change in flux ceases. In some cases this drop of the VRS signal 602 can result in noise, e.g., erroneous transitions generated in the detect signal. Specifically, this can occur when the drop of the VRS signal 602 drops below the threshold values of the comparator used to generate the detect signal.

In this illustrated example this drop in VRS signal 602 occurs and incorrectly results in an erroneous trailing edge of the detect signal pulse being generated at time T3. This transition is early, occurring before the trailing edge of the tooth actually arrives. Then, the subsequent increase in VRS signal 602 at time T4 generates an erroneous leading edge of the detect signal 604 pulse. When the actual trailing edge of the tooth arrives the VRS signal 602 is driven down by the resulting change in reluctance, then at time T5, the VRS interface generates a second trailing edge of the detect signal 604 pulse.

Again, because the erroneous transitions at times T3 and T4 do not correspond to actual edges of a tooth they can result in erroneous determinations of angular position and/or speed of the wheel.

In the embodiments described herein a VRS interface is provided that may reduce the probability of erroneous transitions in the resulting detect signal. As such, the VRS interface can improve the accuracy of position and/or motion determinations, and thus can improve the performance of a wide variety of devices that use variable reluctance sensors. To facilitate this the VRS interface includes a pre-processing circuit configured to modify the VRS signal 602 to prevent the modified VRS signal from dropping below a threshold value and generating erroneous transitions in the detect signal pulse. In one embodiment the pre-processing circuit comprises a peak and hold circuit. In another embodiment the pre-processing circuit comprises a resistor-capacitor (RC) circuit (i.e., a filter circuit including resistive, capacitive, and possibly inductive discrete and/or integrated devices). In either case the pre-processing circuit can prevent erroneous transitions in the detect signal and thus may improve the performance and accuracy of the system.

Turning now to FIG. 1, a simplified schematic diagram of a VRS interface 100 is illustrated. The VRS interface 100 includes a pre-processing circuit 102, a leading edge comparator 104, a trailing edge comparator 106, and a post-processing circuit 108. The VRS interface 100 is configured to receive a VRS signal from a VRS. A detect signal is generated by the VRS interface 100 and provided to an ignition control unit 110. As was described above VRSs are commonly used to measure the angular position and/or speed of rotating objects such as wheels having one or more teeth. In these VRSs the leading and trailing edges of a tooth passing by the VRS cause changes in the magnetic flux, which generate a VRS signal.

The pre-processing circuit 102 receives the VRS signal and is configured to modify the VRS signal to prevent the modified VRS signal from dropping below a second threshold value in a way that would generate erroneous results. Specifically, the modified VRS signal is prevented from dropping below the second threshold value in the portions of the VRS signal between the leading and trailing edges of the tooth.

The leading edge comparator 104 is coupled to the pre-processing circuit 102 and is configured to receive the modified VRS signal. The leading edge comparator 104 includes an output and is configured to provide a leading edge signal at the output responsive to the modified VRS signal reaching a first threshold value. Likewise the trailing edge comparator 106 is coupled to the pre-processing circuit 102 and is configured to also receive the modified VRS signal. The trailing edge comparator 104 includes an output and is configured to provide a trailing edge signal at the output responsive to the modified VRS signal reaching the second threshold value.

The post-processing circuit 108 is configured to receive both the leading edge signal and the trailing edge signal and generate a detect signal pulse responsive to those signals. Specifically, the post-processing circuit 108 generates a detect signal pulse with a leading edge determined from the leading edge signal, and a trailing edge determined from the trailing edge signal. Thus generated, the detect signal pulse has a width corresponding to the timing difference between the leading edge signal and the trailing edge signal. This detect signal pulse can be used to determine the position and/or speed of the tooth and the wheel. Specifically, the ignition control unit 110 receives the detect signal pulse and is configured to control ignition timing based at least in part on the detect signal pulse. For example, the ignition control unit 110 can be configured to determine an angular position of a rotating shaft and control the timing of a capacitive discharge ignition based on that determination.

Furthermore, because the modified VRS signal is prevented from dropping below the second threshold value erroneous transitions in the detect signal pulse may be prevented and the performance and accuracy of the system may improve. Stated another way, by preventing the VRS signal from dropping below the second threshold value the pre-processing circuit 102 can reduce false detections of the trailing tooth edge after the leading tooth edge and thus may provide improved noise immunity.

As will be described in greater detail below, a variety of different types of devices and techniques can be used to implement the pre-processing circuit 102. As one example, the pre-processing circuit 102 can comprise a peak and hold circuit configured to modify the VRS signal to prevent the modified VRS signal from dropping below the second threshold value. In general, a peak and hold circuit samples the peak amplitude of an AC signal and is reset based on the cyclic or periodic nature of the signal being sampled. In one specific embodiment the peak and hold circuit comprises a diode coupled to a capacitor. In this embodiment the diode and capacitor function to keep the VRS signal from dropping too quickly and thus can prevent the VRS signal from dropping below the second threshold value between portions of the signal corresponding to the leading and trailing edges of a tooth.

In another embodiment the pre-processing circuit 102 can comprise an RC circuit. In general such an RC circuit can be implemented with a time constant selected to provide a frequency response sufficient for anticipated maximum rotation rate and width of the tooth. For example, the RC circuit can comprise a low pass filter configured with a frequency response configured to prevent the modified VRS signal from dropping below the second threshold value between portions of the signal corresponding to the leading and trailing edges of a tooth. In such an implementation the frequency response of the low pass filter can be based on the anticipated rotation rates of the toothed wheel, the diameter of the wheel, the tooth characteristics (e.g., size, number, and spacing), etc.

As will be described in greater detail below, in both embodiments the pre-processing circuit 102 can be implemented with individual discrete components. Specifically, the RC circuit and peak and hold circuit can both be implemented with combinations of discrete diodes, resistors, and/or capacitors. This may provide a flexible solution that can be adapted to a variety of devices, including low cost internal combustion engines where more expensive computer controlled systems are cost prohibitive.

The VRS interface 100 can be used in a variety of different applications. For example, the toothed wheel can comprise a trigger wheel coupled to a rotating shaft, and the detect signal pulse used to determine an angular position of a rotating shaft. In such examples the detect signal pulse can be used to generate ignition events for internal combustion engines. In these embodiments the VRS is used to sense the rotation of a crankshaft. From this, the crankshaft position and top dead center can be used to set engine timing, including ignition and fuel injection timing and the like. For example, the VRS can be used in a capacitive discharge ignition (CDI) system. In CDI systems capacitor discharge current is used to fire the spark plugs in the internal combustion engine. CDI systems do not typically suffer from the long charging times associated with the inductance coils used in inductive discharge systems. As such, CDI systems are particularly applicable to high speed engines, but CDI systems are also used in a wide variety of other engines. CDI systems commonly employ one or more relatively large teeth spanning a relatively large angular range around the circumference of the wheel. For example, CDI systems can use one or more teeth that span a range between about 20 degrees to about 70 degrees, with teeth between about 30 and 60 degrees being commonly used. However, the magnetic properties of such a wide tooth are large with respect to the VRS, making the system susceptible to noise when the sensor is positioned between the leading and trailing tooth edges. Such noise can lead to erroneous transitions in the detect signal between edges as was illustrated in FIG. 6. The embodiments described herein thus can be used to reduce the probability that such noise will generate erroneous transitions in the detect signal. And thus, the embodiments described herein are particularly applicable for use in controlling ignition timing in a CDI system that uses relatively wide teeth.

Figure 2:
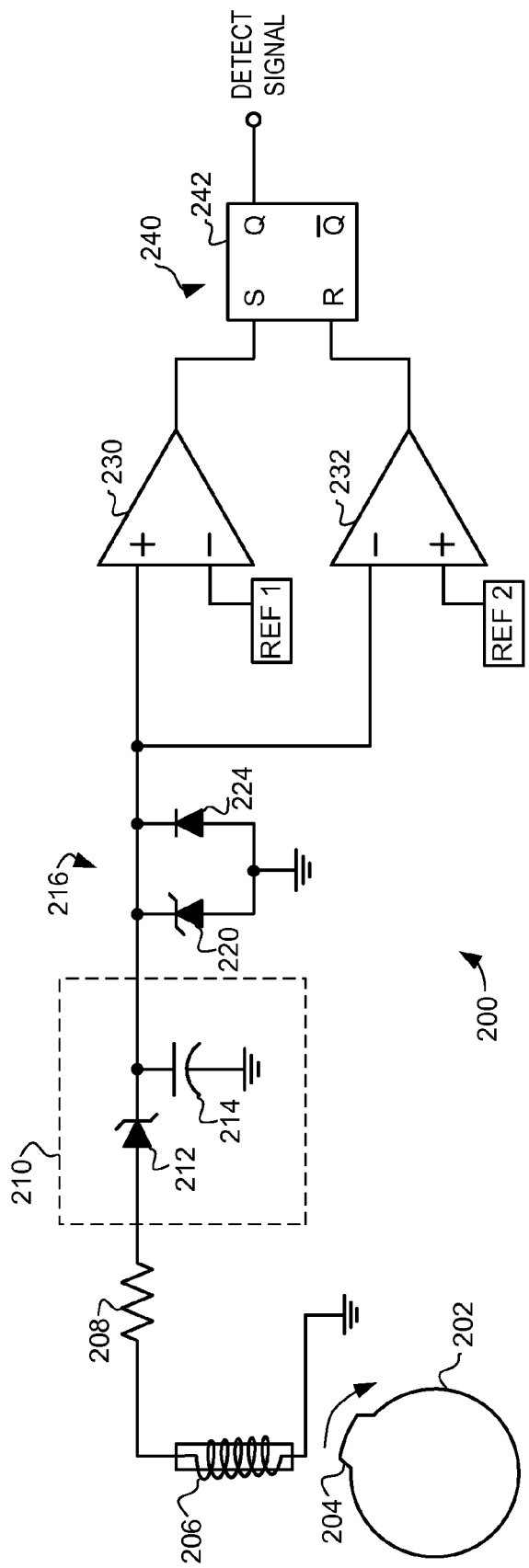
FIG. 2 is a schematic diagram of a variable reluctance sensor interface in accordance with another example embodiment.

Turning now to FIG. 2, a schematic diagram of another embodiment of a VRS interface 200 is illustrated. The VRS interface 200 includes a resistor 208, a pre-processing circuit 210, a clamping circuit 216, a leading edge comparator 230, a trailing edge comparator 232, and a-post-processing circuit 240. In this illustrated example the VRS interface 200 is coupled to a VRS 206. The VRS 206 generates a VRS signal which is processed by VRS interface 200.

Specifically, the VRS sensor 206 is configured to sense the rotation of a tooth 204 on a trigger wheel 202. In the illustrated configuration, the VRS 206 includes a coil and biasing magnet which is orthogonally positioned relative to the trigger wheel 202 mounted to a crankshaft (not shown) or other rotating member. The trigger wheel 202 is configured as a toothed wheel, and the VRS 206 senses each passing of the tooth 204. Specifically, as the trigger wheel 202 rotates, each passing of the tooth 204 causes a change in the magnetic flux of the biasing magnet through the coil. The coil converts this changing magnetic flux to an electrical VRS signal. The VRS signal is applied to the VRS interface 200 at the input node of resistor 208. The actual form of the VRS signal generated by the VRS 206 depends on various system parameters, such as the shape and configuration of the teeth, the position and/or orientation of the VRS 206, etc.

The resistor 208 and the clamping circuit 216 serve to limit the current and voltage swings in the interface 200 to acceptable levels. Specifically, clamping circuit 216 is implemented with the diodes 220 and 224. The diodes 220 and 224 serve to limit voltage swings in the VRS interface 200 to acceptable levels. Likewise, the resistor 208 serves to limit current through the VRS interface 200.

In accordance with the embodiments described herein, the VRS signal is applied to the pre-processing circuit 210 to generate a modified VRS signal. In general, the pre-processing circuit 210 modifies the VRS signal to prevent the modified VRS signal from dropping below a second threshold value in a way that would generate erroneous results. Specifically, the modified VRS signal is prevented from dropping below the second threshold value in the portions of the VRS signal between the leading and trailing edges of the tooth 204.

In this illustrated embodiment the pre-processing circuit 210 comprises a peak and hold circuit. Specifically, a diode 212 and a capacitor 214 are configured to implement a peak and hold circuit. During operation the capacitor 214 temporarily stores charge from the VRS signal, thus smoothing the modified VRS signal. The diode 212 prevents the discharge of the capacitor back to the VRS, and thus also functions to smooth the modified VRS signal. The result is that the modified VRS signal is prevented from dropping below the second threshold value between edges of the tooth 204. However, when the trailing edge of the tooth 204 passes the VRS 206 the VRS signal is driven low enough to pass through the diode via breakdown. As will be described in greater detail below, this allows the true trailing edge of the tooth 204 to be detected and the correct detect signal pulse to be generated.

In one specific embodiment the diode 212 is a Zener diode selected to have a relatively low breakdown voltage. In such an embodiment the relatively low breakdown voltage can be selected to be less than the minimum detectable VRS signal. Having the breakdown voltage less than the minimum detectable VRS signal assures that the negative portion of the VRS signal caused by the trailing edge of the tooth 204 can overcome the Zener diode 212 via breakdown and thus generate the correct trailing edge signal.

In one specific embodiment the capacitor 214 is selected to be large enough that leakage current will not discharge the capacitor 214 in between edges of the tooth 204 to below a selected detection threshold at the lowest operational rotational speed. In a typical implementation the minimum detectable VRS signal depends on the physical attributes of the VRS 206. For example, the minimum detectable VRS signal for the VRS 206 can depend on the number of turns in the coil windings, the magnet strength, and the distance between the tooth 204 and the VRS 206.

The leading edge comparator 230 and trailing edge comparator 232 can be implemented with any suitable types of comparators. For example, the leading edge comparator can be implemented with hysteresis.

The modified VRS signal as modified by the pre-processing circuit 210 is provided to the non-inverting (+) input of the leading edge comparator 230 and to the inverting (−) input of the trailing edge comparator 232. A first reference signal (REF 1) having a first DC voltage value is provided to the inverting input of the leading edge comparator 230. Likewise, a second reference signal (REF 2) having a second DC voltage value is provided to the non-inverting input of the trailing edge comparator 232.

In some embodiments REF 1 and/or REF 2 provide the same or equivalent reference signals. For example, in some embodiments both inputs are grounded or have the same non-zero DC voltage. In other embodiments different reference signals are provided by REF 1 and REF 2 to the inputs of the comparators 230, 232. For example, different voltage values can be provided to individually control the reference values and thus the switching points of the comparators 230 and 232.

During operation the leading edge comparator 230 outputs a leading edge signal to one input of the post-processing circuit 240. This leading edge signal is asserted when a leading edge of a tooth 204 causes an increase in the modified VRS signal above the first threshold value provided by REF 1. Likewise, the trailing edge comparator outputs a trailing edge signal to the other input of the post-processing circuit 240. This trailing edge signal is asserted when a trailing edge of a tooth 204 causes a decrease in the modified VRS signal below the second threshold value provided by REF 2.

It should be noted that because the pre-processing circuit 210 prevents the modified VRS signal from dropping below the second threshold value between portions of the signal corresponding to the leading and trailing edges of a tooth 204 that erroneous transitions in the leading edge signal and trailing edge signal may be avoided. Instead, only transitions corresponding to actual tooth edges are generated and provided to the post-processing circuit 240.

In this illustrated embodiment the post-processing circuit 240 is implemented with a set-reset (SR) latch 242. The leading edge signal is provided to the first input (i.e., the set input) of the latch 242, and the trailing edge signal is provided to the second input (i.e., the reset input) of the latch 242. The latch 242 output asserts in response to an asserted first input, and the latch 242 output resets in response to an asserted reset input. Thus, the latch 242 operates to generate detect signal pulses with the leading edge of the pulse determined by the assertion of the leading edge signal and the trailing edge of the pulse set by the assertion of the trailing edge signal. It should be noted that the SR latch 242 is just one example of the type of circuit that can be used for post-processing 240. For example, other latches and other logic circuits can be used.

And again, because the pre-processing circuit 210 may prevent the modified VRS signal from dropping below the second threshold value between portions of the signal corresponding to the leading and trailing edges of a tooth 204, erroneous transitions that could otherwise occur in the detect signal pulse may be avoided. Instead, only transitions corresponding to actual tooth edges are generated, resulting in a clean and accurate detect signal pulse that may be used to determine the position and/or speed of the rotating wheel 202.

Figure 3:
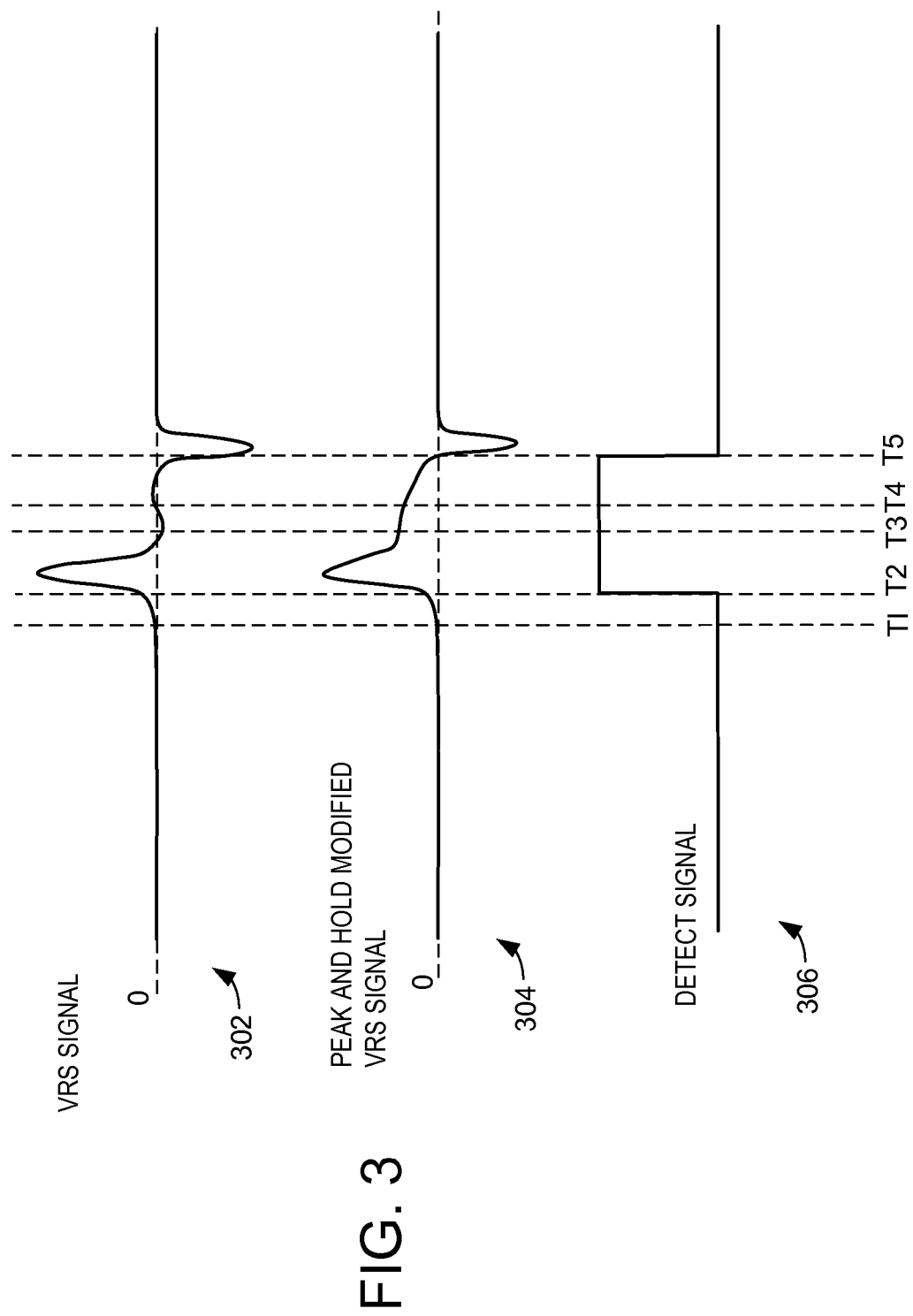
FIG. 3 is a graphical representation of a variable reluctance sensor signal, modified variable reluctance sensor signal, and detect signal pulse in accordance with an example embodiment.

Turning now to FIG. 3, a graphical representation of an exemplary VRS signal 302, modified VRS signal 304, and a resulting detect signal 306 generated by the peak and hold circuit of VRS interface 200 are illustrated. In this example the modified VRS signal 304 has been prevented from dropping below the second threshold value between leading and trailing edges, and thus erroneous transitions in the detect signal 306 that do not correspond to actual tooth edges are not generated.

In general, during operation the VRS signal 302 increases in response to leading tooth edges and decreases when the tooth 204 is aligned with the VRS 206, and then decreases further as the trailing edge passes and the tooth 204 begins to retreat from the VRS 206 reaching a negative peak. The next passing of the tooth 204 generates similar positive and negative pulses in the VRS signal 302 after any dead-time period between passings of the tooth 204 or other consecutive teeth.

Referring now to FIGS. 2 and 3 together, at time T1 the VRS signal 302 begins to increase in response to the leading edge of the tooth 204 rotating to the sensor and the resulting change in magnetic flux. It should be noted that the peak and hold circuit in the pre-processing circuit 210 does not prevent the modified VRS signal 304 from also rising at time T1. At time T2 the VRS interface 200 generates the leading edge of a detect signal 306 pulse in response to the resulting modified VRS signal 304 rising above the first threshold value defined by REF 1. Then, in response to the leading edge of the tooth 204 passing the sensor the VRS signal 302 drops as the change in flux ceases. As was described above with reference to FIG. 6, in some cases this drop of the VRS signal 302 can result in increased susceptibility to noise, creating erroneous output pulses. In the illustrated example erroneous transitions could have been generated at times T3 and T4 (see FIG. 6).

In this illustrated example however, the pre-processing circuit 210 prevents these erroneous transitions by preventing the modified VRS signal 304 from dropping below the second threshold value between times T2 and T5. Specifically, the diode 212 and capacitor 214 provide a peak and hold on the VRS signal 302, with the capacitor 214 temporarily storing charge from the VRS signal 302 and the diode 212 preventing the discharge of the capacitor 214 back to the VRS 206. This results in a smoothing of the modified VRS signal 304. Specifically, after it reaches its peak, note that the modified VRS signal 304 does initially drop and rise like the original VRS signal 302. However, when the trailing edge of the tooth 204 passes the VRS 206 the VRS signal 302 is driven low enough to pass through the diode via breakdown, and thus the modified VRS signal 304 will drop below the second threshold value. This occurs at time T5, and causes the trailing edge of the detect signal 306 pulse to be correctly generated at time T5.

Thus generated, the detect signal 306 pulse has a width corresponding to the timing difference between the actual leading edge and trailing edge of the tooth 204. Both edges of this detect signal pulse can thus be used to accurately determine the angular position and/or rotational speed of the tooth 204 and the wheel 202. Stated another way, by preventing the modified VRS signal from dropping below the second threshold value the pre-processing circuit 210 can reduce false detections of the trailing tooth edge after the leading tooth edge and thus may provide improved noise immunity to the system.

Figure 4:
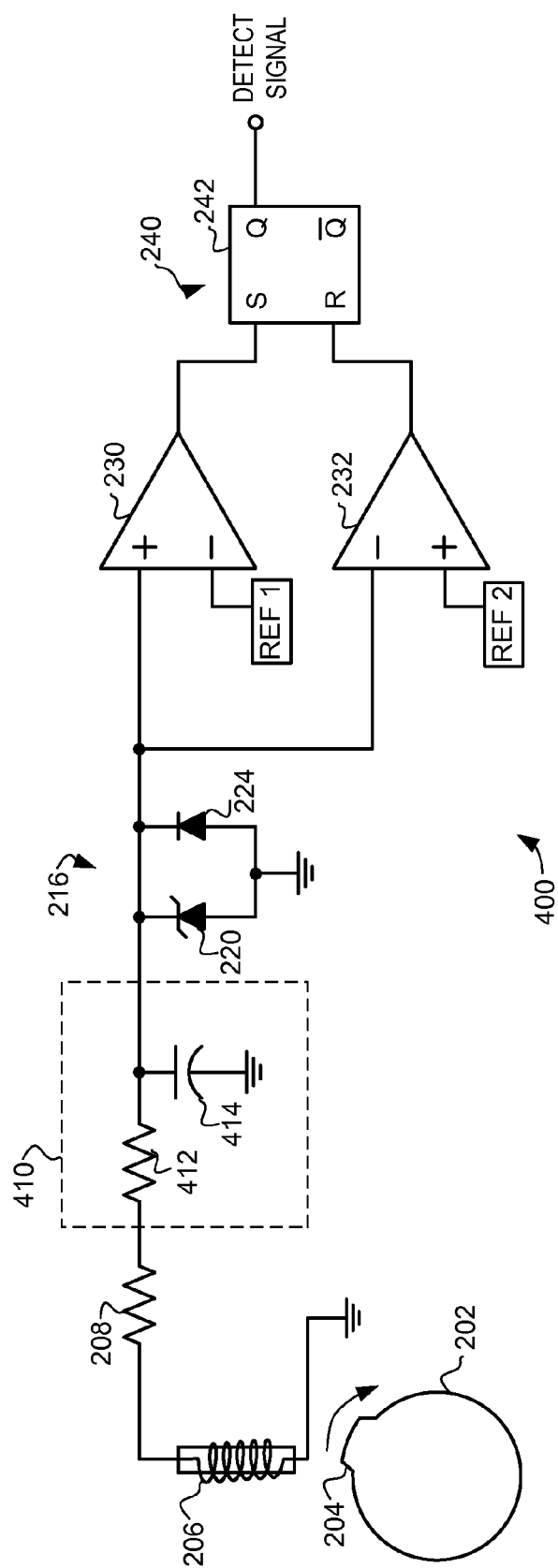
FIG. 4 is a schematic diagram of a variable reluctance sensor interface in accordance with another example embodiment.

Turning now to FIG. 4, a schematic diagram of another embodiment of a VRS interface 400 is illustrated. The VRS interface 400 includes a resistor 208, a pre-processing circuit 410, a clamping circuit 216, a leading edge comparator 230, a trailing edge comparator 232, and a-post-processing circuit 240. In contrast with the VRS interface 200 illustrated in FIG. 2, the VRS interface 400 uses an RC network in the pre-processing circuit 410.

The VRS interface 400 is coupled to a VRS 206. The VRS 206 generates a VRS signal which is applied to the pre-processing circuit 410 to generate a modified VRS signal. In general, the pre-processing circuit 410 modifies the VRS signal to prevent the modified VRS signal from dropping below a second threshold value in a way that would generate erroneous results. Specifically, the modified VRS signal is prevented from dropping below the second threshold value in the portions of the VRS signal between the leading and trailing edges of the tooth 204.

In this illustrated embodiment of FIG. 4 the pre-processing circuit comprises an RC circuit. Specifically, a resistor 412 and a capacitor 414 are configured to implement the RC circuit. During operation the resistor 412 and capacitor 414 function as a low pass filter. The result is that, at frequencies of interest, the modified VRS signal is prevented from dropping below the second threshold value between the leading and trailing edges of the tooth 204. However, when the trailing edge of the tooth 204 passes the VRS 206 the VRS 206 is driven at high enough frequency to pass the RC circuit. As will be described in greater detail below, this allows the true trailing edge of the tooth 204 to be detected and the correct detect signal pulse to be generated.

In one specific embodiment the RC circuit is configured to have a time constant selected to provide a frequency response sufficient for anticipated maximum rotation rate and width of the tooth 204. For example, the RC circuit implemented with resistor 412 and capacitor 414 can have a frequency response configured to prevent the modified VRS signal from dropping below the second threshold value between portions of the signal corresponding to the leading and trailing edges of a tooth 204, while allowing the VRS signal to drop when the real trailing edge passes the VRS 206. In such an implementation the frequency response of the low pass filter can be based on the anticipated rotation rates of the toothed wheel, the diameter of the wheel, the tooth characteristics (size, number, and spacing), etc.

Again, because the pre-processing circuit 410 prevents the modified VRS signal from dropping below the second threshold value between portions of the signal corresponding to the leading and trailing edges of a tooth 204, erroneous transitions in the leading edge signal and trailing edge signal may be avoided. Instead, only transitions corresponding to actual tooth edges are generated and provided to the post-processing circuit 240, and thus only actual transitions are generated in the detect signal pulse outputted by the post-processing circuit 240.

Figure 5:
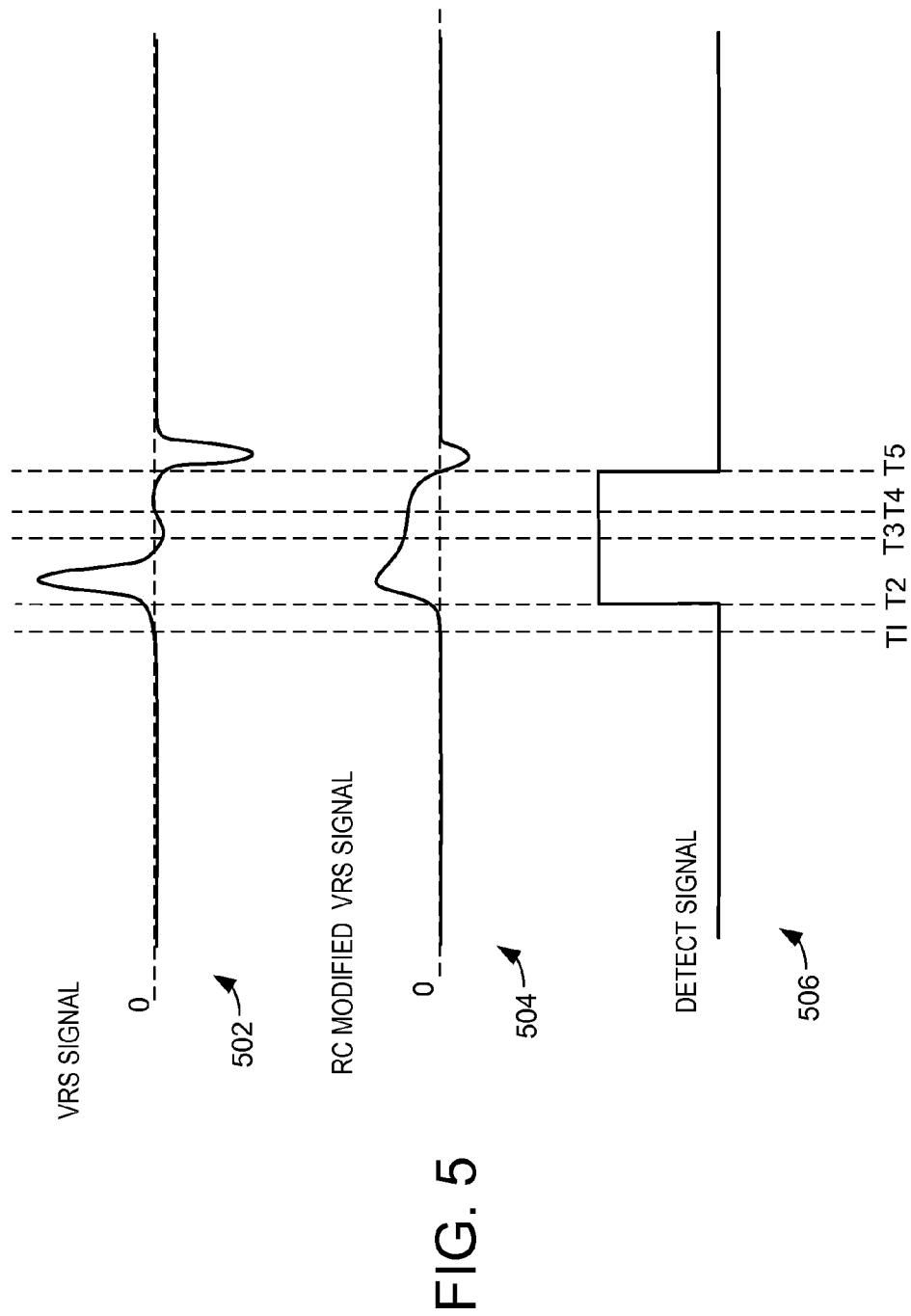
FIG. 5 is a graphical representation of a variable reluctance sensor signal, modified variable reluctance sensor signal, and detect signal pulse in accordance with an another example embodiment.

Turning now to FIG. 5, a graphical representation of an exemplary VRS signal 502, modified VRS signal 504, and a resulting detect signal 506 generated by the peak and hold circuit of VRS interface 400 are illustrated. In this example the modified VRS signal 504 has been prevented from dropping below the second threshold value between leading and trailing edges, and thus erroneous transitions in the detect signal 506 that do not correspond to actual tooth edges are not generated.

Again, during operation the VRS signal 502 increases in response to leading tooth edges and decreases when the tooth 204 is aligned with the VRS 206, and then decreases further as the trailing edge passes and the tooth 204 begins to retreat from the VRS 206 reaching a negative peak. The next passing of the tooth 204 generates similar positive and negative pulses in the VRS signal 502 after any dead-time period between the passing of the tooth 204 or other consecutive teeth.

Referring now to FIGS. 4 and 5 together, at time T1 the VRS signal 502 begins to increase in response to the leading edge of the tooth 204 rotating to the sensor and the resulting change in magnetic flux. It should be noted that the RC circuit in the pre-processing circuit 410 does not prevent the modified VRS signal 504 from also rising. At time T2 the VRS interface 400 generates the leading edge of a detect signal 506 pulse in response to the resulting modified VRS signal 504 rising above the first threshold value defined by REF 1. Then, after reaching a peak and in response to the leading edge of the tooth 204 passing the VRS 206 the VRS signal 502 drops as the change in flux ceases. Again, the pre-processing circuit 410 should prevent erroneous transitions by preventing the modified VRS signal 504 from dropping below the second threshold value between times T2 and T5. Specifically, the resistor 412 and the capacitor 414 provide a low pass filter that temporarily prevents the modified VRS signal 504 from dropping at a high rate. This results in a smoothing of the modified VRS signal 504. Again, note that the modified VRS signal 504 does initially drop and rise like the original VRS signal 502. However, when the trailing edge of the tooth 204 passes the VRS 206 the VRS signal 502 is driven low enough to pass through the RC circuit, and thus the modified VRS signal 504 will drop below the second threshold value. This occurs at time T5, and causes the trailing edge of the detect signal 506 pulse to be correctly generated at time T5.

Thus generated, the detect signal 506 pulse has a width corresponding to the timing difference between actual leading edge and trailing edge of the tooth 204. This detect signal pulse can thus be used to accurately determine the position and/or speed of the tooth 204 and the wheel 202. Stated another way, by preventing the modified VRS signal from dropping below the second threshold value the pre-processing circuit 410 can reduce false detections of the trailing tooth edge after the leading tooth edge and thus may provide improved noise immunity to the system.

In one embodiment a variable reluctance sensor interface for processing a variable reluctance sensor signal that reflects a magnetic flux variation that occurs when a tooth passes by a variable reluctance sensor, wherein the tooth has a leading tooth edge and a trailing tooth edge comprises: a pre-processing circuit configured to modify the variable reluctance sensor signal to prevent the variable reluctance sensor signal from dropping below a second threshold value between a first portion of the variable reluctance sensor signal corresponding to the leading tooth edge and a second portion of the variable reluctance sensor signal corresponding to the trailing tooth edge; a leading edge comparator including a first input configured to receive the modified variable reluctance sensor signal and including an output configured to provide a leading edge signal responsive to the modified variable reluctance sensor signal reaching a first threshold value; a trailing edge comparator including a first input configured to receive the modified variable reluctance sensor signal and including an output configured to provide a trailing edge signal responsive to the modified variable reluctance sensor signal reaching the second threshold value; and a post-processing circuit configured to receive the leading edge signal and the trailing edge signal and generate a detect signal pulse having a width corresponding to a timing difference between the leading edge signal and the trailing edge signal.

In another embodiment a capacitor discharge ignition system for an internal combustion engine comprises: a variable reluctance sensor configured to sense passing of at least one tooth on a wheel in an internal combustion engine, the variable reluctance sensor configured to generate a variable reluctance sensor signal; a pre-processing circuit configured to modify the variable reluctance sensor signal to prevent the variable reluctance sensor signal from dropping below a second threshold value between a first portion of the variable reluctance sensor signal corresponding to a leading tooth edge and a second portion of the variable reluctance sensor signal corresponding to a trailing tooth edge; a leading edge comparator including a first input configured to receive the modified variable reluctance sensor signal and including an output configured to provide a leading edge signal responsive to the modified variable reluctance sensor signal reaching a first threshold value; a trailing edge comparator including a first input configured to receive the modified variable reluctance sensor signal and including an output configured to provide a trailing edge signal responsive to the modified variable reluctance sensor signal reaching the second threshold value; a post-processing circuit configured to receive the leading edge signal and the trailing edge signal and generate a detect signal pulse having a width corresponding to a timing difference between the leading edge signal and the trailing edge signal; and an ignition control unit configured to control ignition timing based at least in part on the detect signal pulse.

In another embodiment a method for processing a variable reluctance sensor signal that reflects a magnetic flux variation that occurs when a tooth passes by a variable reluctance sensor, wherein the tooth has a leading tooth edge and a trailing tooth edge, the method comprises: modifying the variable reluctance sensor signal to prevent the variable reluctance sensor signal from dropping below a second threshold value between a first portion of the variable reluctance sensor signal corresponding to the leading tooth edge and a second portion of the variable reluctance sensor signal corresponding to the trailing tooth edge; generating a leading edge signal responsive to the modified variable reluctance sensor signal reaching a first threshold value; generating a trailing edge signal responsive to the modified variable reluctance sensor signal reaching the second threshold value; and generating a detect signal pulse having a width corresponding to a timing difference between the leading edge signal and the trailing edge signal.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A variable reluctance sensor interface for processing a variable reluctance sensor signal that reflects a magnetic flux variation that occurs when a tooth passes by a variable reluctance sensor, wherein the tooth has a leading tooth edge and a trailing tooth edge, the variable reluctance sensor interface comprising:

a pre-processing circuit configured to modify the variable reluctance sensor signal to prevent the variable reluctance sensor signal from dropping below a second threshold value between a first portion of the variable reluctance sensor signal corresponding to the leading tooth edge and a second portion of the variable reluctance sensor signal corresponding to the trailing tooth edge;

a leading edge comparator including a first input configured to receive the modified variable reluctance sensor signal and including an output configured to provide a leading edge signal responsive to the modified variable reluctance sensor signal reaching a first threshold value;

a trailing edge comparator including a first input configured to receive the modified variable reluctance sensor signal and including an output configured to provide a trailing edge signal responsive to the modified variable reluctance sensor signal reaching the second threshold value; and a post-processing circuit configured to receive the leading edge signal and the trailing edge signal and generate a detect signal pulse having a width corresponding to a timing difference between the leading edge signal and the trailing edge signal.

2. The variable reluctance sensor interface of claim 1 wherein the tooth is on a trigger wheel coupled to a rotating shaft and wherein the detect signal pulse is used to determine an angular position of the rotating shaft.

3. The variable reluctance sensor interface of claim 1 wherein the pre-processing circuit comprises a peak and hold circuit.

4. The variable reluctance sensor interface of claim 3 wherein the peak and hold circuit comprise a diode coupled to a capacitor.

5. The variable reluctance sensor interface of claim 4 wherein the diode is a Zener diode having a breakdown voltage less than a minimum detectable VRS signal.

6. The variable reluctance sensor interface of claim 1 wherein the pre-processing circuit comprises a resistor-capacitor (RC) circuit.

7. The variable reluctance sensor interface of claim 6 wherein the RC circuit comprises a low pass filter.

8. The variable reluctance sensor interface of claim 6 wherein the RC circuit has a time constant selected to provide a frequency response sufficient for anticipated maximum rotation rate and width of the tooth.

9. A capacitor discharge ignition system for an internal combustion engine, comprising:

a variable reluctance sensor configured to sense passing of at least one tooth on a wheel in an internal combustion engine, the variable reluctance sensor configured to generate a variable reluctance sensor signal;

a pre-processing circuit configured to modify the variable reluctance sensor signal to prevent the variable reluctance sensor signal from dropping below a second threshold value between a first portion of the variable reluctance sensor signal corresponding to a leading tooth edge and a second portion of the variable reluctance sensor signal corresponding to a trailing tooth edge;

a leading edge comparator including a first input configured to receive the modified variable reluctance sensor signal and including an output configured to provide a leading edge signal responsive to the modified variable reluctance sensor signal reaching a first threshold value;

a trailing edge comparator including a first input configured to receive the modified variable reluctance sensor signal and including an output configured to provide a trailing edge signal responsive to the modified variable reluctance sensor signal reaching the second threshold value;

a post-processing circuit configured to receive the leading edge signal and the trailing edge signal and generate a detect signal pulse having a width corresponding to a timing difference between the leading edge signal and the trailing edge signal; and an ignition control unit configured to control ignition timing based at least in part on the detect signal pulse.

10. The capacitor discharge ignition system of claim 9 wherein the wheel is coupled to a crankshaft in the internal combustion engine and wherein the detect signal pulse is used to determine an angular position of the crankshaft.

11. The capacitor discharge ignition system of claim 9 wherein the pre-processing circuit comprises a peak and hold circuit.

12. The capacitor discharge ignition system of claim 11 wherein the peak and hold circuit comprise a diode coupled to a capacitor.

13. The capacitor discharge ignition system of claim 12 wherein the diode is a Zener diode having a breakdown voltage less than a minimum detectable VRS signal.

14. The capacitor discharge ignition system of claim 9 wherein the pre-processing circuit comprises a resistor-capacitor (RC) circuit.

15. The capacitor discharge ignition system of claim 14 wherein the RC circuit comprises a low pass filter.

16. The capacitor discharge ignition system of claim 14 wherein the RC circuit has a time constant selected to provide a frequency response sufficient for anticipated maximum rotation rate and width of the tooth.

17. A method for processing a variable reluctance sensor signal that reflects a magnetic flux variation that occurs when a tooth passes by a variable reluctance sensor, wherein the tooth has a leading tooth edge and a trailing tooth edge, the method comprising:

modifying the variable reluctance sensor signal to prevent the variable reluctance sensor signal from dropping below a second threshold value between a first portion of the variable reluctance sensor signal corresponding to the leading tooth edge and a second portion of the variable reluctance sensor signal corresponding to the trailing tooth edge;

generating a leading edge signal responsive to the modified variable reluctance sensor signal reaching a first threshold value;

generating a trailing edge signal responsive to the modified variable reluctance sensor signal reaching the second threshold value; and generating a detect signal pulse having a width corresponding to a timing difference between the leading edge signal and the trailing edge signal.

18. The method of claim 17 wherein the tooth is on a trigger wheel coupled to a rotating shaft and wherein the detect signal pulse is used to determine an angular position of a rotating shaft.

19. The method of claim 17 wherein the modifying the variable reluctance sensor signal to prevent the variable reluctance sensor signal from dropping below the second threshold value comprises using a peak and hold circuit.

20. The method of claim 17 wherein the modifying the variable reluctance sensor signal to prevent the variable reluctance sensor signal from dropping below the second threshold value comprises using a resistor-capacitor (RC) circuit that comprises a low pass filter selected to provide a frequency response sufficient for anticipated maximum rotation rate and width of the tooth.

\* \* \* \* \*